US008912627B2

(12) United States Patent
Yang et al.

(10) Patent No.: US 8,912,627 B2
(45) Date of Patent: Dec. 16, 2014

(54) ELECTRICAL FUSE STRUCTURE AND METHOD OF FABRICATING SAME

(71) Applicant: International Business Machines Corporation, Armonk, NY (US)

(72) Inventors: Chih-Chao Yang, Glenmont, NY (US); David V. Horak, Essex Junction, VT (US); Charles W. Koburger, III, Delmar, NY (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/777,493

(22) Filed: Feb. 26, 2013

(65) Prior Publication Data

US 2013/0168806 A1   Jul. 4, 2013

Related U.S. Application Data

(62) Division of application No. 12/890,941, filed on Sep. 27, 2010, now Pat. No. 8,609,534.

(51) Int. Cl.
| | |
|---|---|
| *H01L 23/52* | (2006.01) |
| *H01L 21/768* | (2006.01) |
| *H01L 23/525* | (2006.01) |
| *H01L 23/522* | (2006.01) |

(52) U.S. Cl.
CPC ...... *H01L 23/5256* (2013.01); *H01L 21/76805* (2013.01); *H01L 21/76807* (2013.01); *H01L 21/76831* (2013.01); *H01L 23/5226* (2013.01)
USPC .................... 257/529; 438/639; 257/E21.592

(58) Field of Classification Search
None
See application file for complete search history.

(56) References Cited

U.S. PATENT DOCUMENTS

| | | | |
|---|---|---|---|
| 4,227,168 A | 10/1980 | Knapp, Jr. | |
| 4,228,417 A | 10/1980 | Belcher | |
| 4,240,058 A | 12/1980 | Kozacka et al. | |
| 4,245,208 A | 1/1981 | Belcher | |
| 4,254,394 A | 3/1981 | Kozacka et al. | |
| 4,272,752 A | 6/1981 | Jacobs, Jr. | |
| 4,306,212 A | 12/1981 | Belcher | |

(Continued)

OTHER PUBLICATIONS

Office Action dated Apr. 22, 2013 received in a related U.S. Patent Application, namely U.S. Appl. No. 12/890,941.

(Continued)

*Primary Examiner* — Sonya D McCall Shepard
(74) *Attorney, Agent, or Firm* — Scully, Scott, Murphy & Presser, P.C.; H. Daniel Schnurmann.

(57) ABSTRACT

A high programming efficiency electrical fuse is provided utilizing a dual damascene structure located atop a metal layer. The dual damascene structure includes a patterned dielectric material having a line opening located above and connected to an underlying via opening. The via opening is located atop and is connected to the metal layer. The dual damascene structure also includes a conductive feature within the line opening and the via opening. Dielectric spacers are also present within the line opening and the via opening. The dielectric spacers are present on vertical sidewalls of the patterned dielectric material and separate the conductive feature from the patterned dielectric material. The presence of the dielectric spacers within the line opening and the via opening reduces the area in which the conductive feature is formed. As such, a high programming efficiency electrical fuse is provided in which space is saved.

13 Claims, 5 Drawing Sheets

(56) References Cited

U.S. PATENT DOCUMENTS

| | | | |
|---|---|---|---|
| 5,985,762 A * | 11/1999 | Geffken et al. | 438/687 |
| 6,218,279 B1 | 4/2001 | Weber et al. | |
| 6,358,842 B1 | 3/2002 | Zhou et al. | |
| 6,380,084 B1 * | 4/2002 | Lim et al. | 438/687 |
| 6,555,458 B1 | 4/2003 | Yu | |
| 6,611,039 B2 | 8/2003 | Anthony | |
| 6,754,135 B2 | 6/2004 | Pilo | |
| 6,756,655 B2 | 6/2004 | Le et al. | |
| 6,897,543 B1 | 5/2005 | Huang et al. | |
| 6,987,059 B1 | 1/2006 | Burke et al. | |
| 6,998,865 B2 | 2/2006 | Bard et al. | |
| 7,157,782 B1 | 1/2007 | Shih et al. | |
| 7,205,588 B2 | 4/2007 | Jeng et al. | |
| 7,271,087 B2 | 9/2007 | Chun | |
| 7,272,067 B1 | 9/2007 | Huang et al. | |
| 7,460,003 B2 | 12/2008 | Hsu et al. | |
| 7,488,679 B2 * | 2/2009 | Standaert et al. | 438/622 |
| 7,649,240 B2 | 1/2010 | Kim et al. | |
| 8,062,972 B2 | 11/2011 | Liu et al. | |
| 2006/0131756 A1 * | 6/2006 | Bae | 257/774 |
| 2008/0237786 A1 | 10/2008 | Yang et al. | |

OTHER PUBLICATIONS

Rizzolo, R. F., et al., "IBM System z9 eFUSE applications and methodology", IBM J. Res. & Dev., Jan./Mar. 2007, vol. 51 No. 1/2.

Takaoka, H., et al., "A Novel Via-fuse Technology Featuring Highly Stable Blow Operation with Large On-off Ratio for 32nm Node and Beyond", IEDM 2007, pp. 43-46.

* cited by examiner

ELECTRICAL FUSE STRUCTURE AND METHOD OF FABRICATING SAME

CROSS REFERENCE TO RELATED APPLICATION

This application is a divisional of U.S. patent application Ser. No. 12/890,941, filed Sep. 27, 2010, the entire content and disclosure of which is incorporated herein by reference.

BACKGROUND

The present disclosure relates to a semiconductor structure and a method of fabricating the same. More particularly, the present disclosure relates to a high programming efficiency electrical fuse (eFuse) structure and a method of fabricating the same.

Electrical fuses (eFuses) are used in the semiconductor industry to implement array redundancy, field programmable arrays, analog component trimming circuits, and chip identification circuits. Once programmed, the programmed state of an electrical fuse does not revert to the original state on its own, that is, the programmed state of the fuse is not reversible. For this reason, electrical fuses are called One-Time-Programmable (OTP) memory elements.

A typical mechanism for programming an electrical fuse is electromigration of a conductive material induced by an applied electrical field and an elevated temperature on a portion of the electrical fuse structure. The conductive material is electromigrated under these conditions from the portion of the electrical fuse structure, thereby increasing the resistance of the electrical fuse structure. The rate and extent of electromigration during programming of an electrical fuse is dependent on the temperature and the current density at the electromigrated portion.

An electrical fuse typically comprises an anode, a cathode, and a fuselink. The fuselink is a narrow strip of a conductive material such as a metal adjoining the anode and cathode, which may also be composed of a metal. During programming of the electrical fuse, a positive voltage bias is applied to the anode and a negative voltage bias is applied to the cathode. As electrical current flows through the fuselink having a narrow cross-sectional area, the temperature of the fuselink is elevated. A high current density combined with the elevated temperature at the fuselink facilitates electromigration of the conductive material. Electromigration, in turn, causes the conductive material to pile up and form hillocks at the anode of the electrical fuse.

In the formation of current electrical metal fuse structures, one of the main problems that is encountered is the requirement of large spaces and a very complex processing operation, particularly involving copper. In addition, metal fuse rules are limited to particular restrictive values. Based on the foregoing, a need exists to reduce the space required in the formation of electrical metal fuses used in integrated circuit devices.

SUMMARY

A high programming efficiency electrical fuse that is perpendicular to a surface of a semiconductor chip is provided utilizing a dual damascene structure located atop a metal layer. The dual damascene structure includes a patterned dielectric material having a line opening located above and connected to an underlying via opening. The via opening is located atop and is connected to the metal layer. The dual damascene structure also includes a conductive feature within the line opening and the via opening. Dielectric spacers are also present within the line opening and the via opening. The dielectric spacers are present on vertical sidewalls of the patterned dielectric material and separate the conductive feature from the patterned dielectric material. The presence of the dielectric spacers within the line opening and the via opening reduces the area in which the conductive feature is formed. As such, a high programming efficiency electrical fuse is provided in which space is saved.

In one aspect of the present disclosure, an electrical fuse structure is provided. The electrical fuse structure includes a metal layer located on a substrate. A patterned dielectric material including a via opening and a line opening is located atop the metal layer. The line opening is located above and connected to the via opening and the via opening is located above and connected to the metal layer. In some embodiments, a patterned dielectric capping layer is present between the metal layer and the patterned dielectric material. A conductive feature including at least a diffusion barrier and a conductive material is present in the via opening and the line opening. Dielectric spacers are also located within the via opening and the line opening and separate the conductive feature from sidewalls of the patterned dielectric material.

In another aspect of the present disclosure, a method of fabricating an electrical fuse structure is provided. The method includes providing a patterned dielectric material including a via opening and a line opening atop a metal layer. The line opening is located above and connected to the via opening and the via opening is located above the metal layer. Dielectric spacers are formed within the via opening and the line opening and are located on sidewalls of the patterned dielectric material. A conductive feature including at least a diffusion barrier and a conductive material is formed within the remaining portions of the via opening and the line opening.

DETAILED DESCRIPTION

Figure 1A:
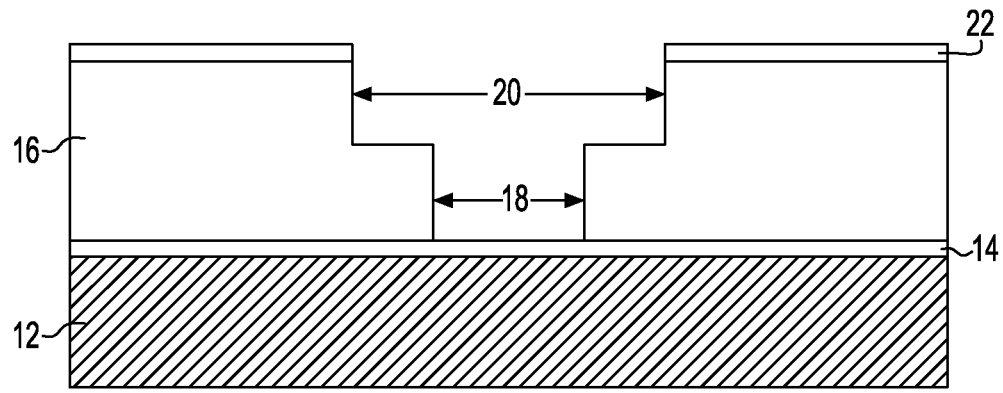
FIG. 1A is a pictorial representation (through a cross sectional view) depicting an initial structure including a metal layer, a dielectric capping layer located on the metal layer, a patterned dielectric material including a via opening and a line opening located on the dielectric capping layer, and a patterned hard mask located on the patterned dielectric material that can be employed in one embodiment of the present disclosure.

The present disclosure, which provides a high programming efficiency electrical fuse structure and a method of fabricating the same, will now be described in greater detail by referring to the following discussion and drawings that accompany the present disclosure. It is noted that the drawings are provided for illustrative purposes only and are not drawn to scale.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A high programming efficiency electrical fuse that is perpendicular to a surface of a semiconductor chip is provided utilizing a dual damascene structure located atop a metal layer. The dual damascene structure includes a patterned dielectric material having a line opening located above and connected to an underlying via opening. The via opening is located atop and is connected to the metal layer. The dual damascene structure also includes a conductive feature within the line opening and the via opening. Dielectric spacers are also present within the line opening and the via opening. The dielectric spacers are present on vertical sidewalls of the patterned dielectric material and separate the conductive feature from the patterned dielectric material. The presence of the dielectric spacers within the line opening and the via opening reduces the area in which the conductive feature is formed. As such, a high programming efficiency electrical fuse is provided in which space is saved.

Reference will now be made to FIGS. 1A-5A and 1B-5B which illustrate various embodiments of the present disclosure that can be employed in fabricating a high programming efficiency electrical fuse. The embodiments differ in that a non-patterned dielectric capping layer is initially employed in FIGS. 1A-2A, while a patterned dielectric capping layer is initially employed in FIGS. 1B-2B. Although embodiments are illustrated showing the presence of a dielectric capping layer (patterned or non-patterned), the present disclosure can also be practiced without a dielectric capping layer (patterned or non-patterned) being present.

Figure 1B:
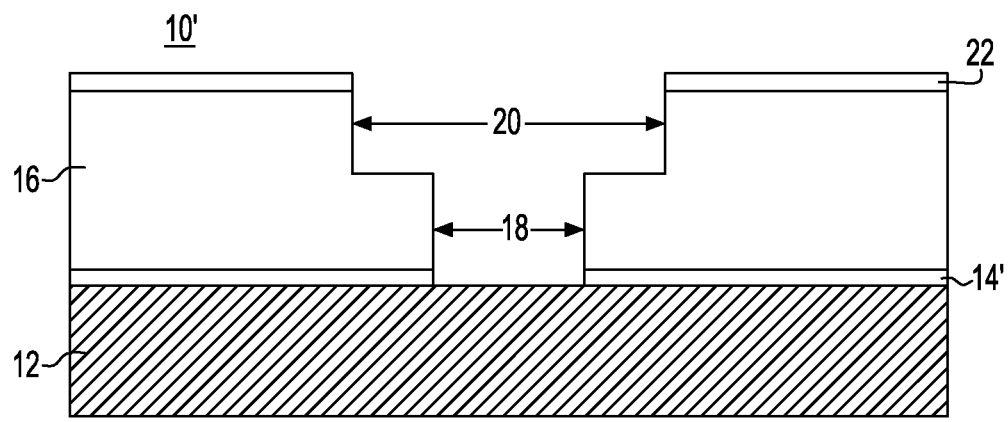
FIG. 1B is a pictorial representation (through a cross sectional view) depicting an initial structure including a metal layer, a patterned dielectric capping layer having at least one opening located on the metal layer, a patterned dielectric material including a via opening and a line opening located on the patterned dielectric capping layer, and a patterned hard mask located on the patterned dielectric material that can be employed in another embodiment of the present disclosure.

Referring first to FIGS. 1A and 1B there are illustrated initial structures 10 and 10', respectively, which can be employed in the present disclosure. The initial structure 10 illustrated in FIG. 1A includes a metal layer 12 that is located on a substrate (not shown), a non-patterned dielectric capping layer 14 is located on the metal layer 12, a patterned dielectric material 16 including a via opening 18 and a line opening 20 is located on the non-patterned dielectric capping layer 14, and a patterned hard mask 22 is located on the patterned dielectric material 16. The initial structure 10' illustrated in FIG. 1B includes a metal layer 12 that is located on a substrate (not shown), a patterned dielectric capping layer 14' having an opening is located on the metal layer 12, a patterned dielectric material 16 including a via opening 18 and a line opening 20 is located on the non-patterned dielectric capping layer 14, and a patterned hard mask 22 is located on the patterned dielectric material 16. It is observed that in both initial structures the line opening 20 is located above and is in direct contact with the via opening 18. In the embodiment including the patterned dielectric capping layer 14', the patterned dielectric capping layer 14' includes an opening that is located beneath the via opening 18 and the opening in the patterned dielectric capping layer 14' is in direct contact with the via opening 18.

The initial structures 10 and 10' shown in FIGS. 1A and 1B are fabricated utilizing conventional techniques well known to those skilled in the art. Also, the various elements included in FIGS. 1A-1B are comprised of materials that are well known to those skilled in the art.

Each of the initial structures 10 and 10' illustrated in FIGS. 1A and 1B, respectively, includes a metal layer 12 that is located on a substrate (not shown). The substrate that is not shown can include a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, an alloy of an elemental metal, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The metal layer 12 of initial structures 10 and 10' is comprised of any conductive metal including, for example, an elemental metal, an alloy of an elemental metal, a metal nitride, a metal silicide or combinations thereof including multilayers. In one embodiment of the present disclosure, the metal layer 12 is comprised of Cu, W, Al or alloys thereof. In another embodiment of the present disclosure, the metal layer 12 is comprised of Cu or a Cu alloy such as, for example, AlCu.

The metal layer 12 can be formed on an exposed upper surface of the substrate (not shown) utilizing any conventional deposition process including, for example, chemical vapor deposition (CVD), plasma enhanced chemical vapor deposition (PECVD), physical vapor deposition (PVD), sputtering, plating, chemical solution deposition and electroless plating. The thickness of the metal layer 12 can vary depending on the number of metal layers within metal layer 12, the type of metal layer being formed and the technique used in forming the same. Typically, the metal layer 12 has a thickness from 80 nm to 5000 nm, with a thickness from 200 nm to 1000 nm being more typical.

After forming the metal layer 12, a blanket layer of dielectric capping material can be formed on an upper exposed surface of the metal layer. The blanket layer of dielectric capping material comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The blanket layer of dielectric capping material can be formed utilizing a conventional deposition process such as, for example, CVD, PECVD, and spin-on coating. The thickness of the blanket layer of dielectric capping material may vary depending on the technique used to form the same as well as the material make-up of the layer. Typically, the blanket layer of dielectric capping material has a thickness from 15 nm to 55 nm, with a thickness from 25 nm to 45 nm being more typical. In the embodiment in which the dielectric capping layer is not patterned, the blanket layer of dielectric capping material is dielectric capping layer 14 shown in FIG. 1A. In the embodiment in which the dielectric capping layer is patterned, the blanket layer of dielectric capping material is subjected to a subsequent etching step that patterns the blanket layer of dielectric capping material into patterned dielectric capping layer 14' as is illustrated in FIG. 1B. The subsequent etch occurs after forming line and via openings within an overlying dielectric material.

After forming the blanket layer of dielectric capping material, a blanket layer of a dielectric material is formed on an exposed upper surface of the blanket layer of dielectric capping material. In embodiments in which no dielectric capping layer (patterned or non-patterned) is present in the initial structure, the blanket layer of dielectric material is formed on an exposed upper surface of metal layer 12.

The blanket layer of dielectric material comprises any interlevel or intralevel dielectric material including inorganic dielectrics or organic dielectrics. In one embodiment, the blanket layer of dielectric material may be porous. In another embodiment, the blanket layer of dielectric material can be non-porous. In yet another embodiment, the blanket layer of dielectric material can include at least one porous region and at least one non-porous region. Some examples of suitable dielectrics that can be employed as the blanket layer of dielectric material include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The blanket layer of dielectric material typically has a dielectric constant of 4.0 or less, with a dielectric constant of 2.8 or less being even more typical. All dielectric constants mentioned in this disclosure are relative to a vacuum unless otherwise stated. These dielectrics generally have a lower parasitic crosstalk as compared with dielectric materials that have a higher dielectric constant than 4.0.

The blanket layer of dielectric material can be formed utilizing any conventional deposition process including, for example, chemical vapor deposition (CVD), plasma enhanced chemical vapor deposition (PECVD), evaporation, chemical solution deposition and spin-on coating. The thickness of the blanket layer of dielectric material may vary depending upon the dielectric material used as well as the exact number of dielectrics within the layer. Typically, the blanket layer of dielectric material has a thickness from 200 nm to 450 nm.

After providing the blanket layer of dielectric material, a blanket layer of a hard mask material is formed on an exposed upper surface of the blanket layer of dielectric material. The blanket layer of hard mask material may comprise a semiconductor oxide, a semiconductor nitride, a semiconductor oxynitride or a multilayered stack thereof. In one embodiment, the blanket layer of hard mask material comprises an oxide of silicon, e.g., silicon oxide, or a nitride of silicon, e.g., a silicon nitride.

In some embodiments, the blanket layer of hard mask material may be formed utilizing any conventional deposition process including, for example, chemical vapor deposition (CVD), plasma enhanced chemical vapor deposition (PECVD), evaporation, chemical solution deposition, physical vapor deposition (PVD) and atomic layer deposition (ALD). In other embodiments, the blanket layer of hard mask material is formed by a thermal process such as, for example, a thermal oxidation, a thermal nitridation and/or a thermal oxynitridation process. In yet other embodiments, the blanket layer of hard mask material is formed utilizing a combination of deposition and thermal processes.

The thickness of the blanket layer of hard mask material may vary depending on the number of materials within the blanket layer itself as well as the technique that was used in forming the same. Typically, the blanket layer of hard mask material has a thickness from 10 nm to 80 nm.

After forming the blanket layer of hard mask material on an exposed upper surface of the blanket layer of dielectric material, the blanket layer of hard mask material and the blanket layer of dielectric material are patterned forming a patterned hard mask 22 located atop a patterned dielectric material 16. The patterned dielectric material 16 has a line opening 20 and a via opening 18 as is illustrated in FIGS. 1A and 1B located therein. The patterning of the blanket layer of hard mask material and the blanket layer of dielectric material includes a dual damascene process. In one embodiment, the dual damascene process includes forming the line opening 20 first and then forming the via opening 18. In another embodiment, the dual damascene process includes forming the via opening 18 first and then the line opening 20. It is observed that while FIGS. 1A and 1B illustrate the formation of a single via opening and a single line opening, the present disclosure also can be practiced when a plurality of via openings and a plurality of line openings are formed.

Notwithstanding the order of forming the line and via openings, the dual damascene process that can be employed in this disclosure includes lithography and etching. Lithography includes applying a photoresist (not shown) atop the blanket layer of hard mask material utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the blanket layer of hard mask material that defines the width of the opening (via or line) to be subsequently formed into the blanket layer of dielectric material. After providing the patterned photoresist, the pattern is transferred into the blanket layer of hard mask material and then subsequently into the blanket layer of dielectric material utilizing one or more etching processes. The patterned photoresist can be stripped immediately after the pattern is transferred into the blanket layer of hard mask material forming patterned hard mask 22 utilizing a conventional stripping process. Alternatively, the patterned photoresist can be stripped after the pattern is transferred into the blanket layer of dielectric material. The etch used in transferring the pattern may comprise a dry etching process, a wet chemical etching process or a combination thereof. The term "dry etching" is used herein to denote an etching technique such as reactive-ion etching, ion beam etching, plasma etching or laser ablation. After providing either the via or line opening within the blanket layer of dielectric material, another iteration of patterning the dielectric material is performed to form the other of the via or line opening not previous formed into the dielectric material.

In some embodiments of the present disclosure, and as shown in FIG. 1B, during the formation of the via opening within the dielectric material, one of the etching steps can also remove a portion of the blanket layer of dielectric capping material that is located atop metal layer 12 forming patterned dielectric capping layer 14'.

The width of the via opening 18 and width of the line opening 20 that are formed into the dielectric material may vary depending on the type of lithography and etching employed in a certain technology node. Typically, the width of the via opening 18 that is formed at this point of the present disclosure is from 5 nm to 1000 nm, with a width from 35 nm to 200 nm being more typical. The width of the line opening 20 that is formed at this point of the present disclosure is from 10 nm to 2000 nm, with a width from 70 nm to 400 nm being more typical.

It is observed that if an electric fuse structure was formed at this point of the present disclosure a high programming efficiency electrical fuse would not be obtained because the widths of the line and via openings mentioned above are too large. Also, if the electric fuse structure was formed at this point of the present disclosure space saving would not be obtained since the widths of the line and via openings mentioned above are too large.

In order to provide a high programming efficiency electrical fuse with space saving, applicants decreased the width of the via and line openings by forming dielectric spacers within both the line and via openings. The spacer formation is shown in FIGS. 2A, 2B, 3A and 3B. First, and referring to FIGS. 2A and 2B, a spacer material 24 is formed atop the patterned hard mask 16 and within the via opening 18 and the line opening 20. In the embodiment in which the dielectric capping layer is non-patterned, a portion of the spacer material is formed on an exposed upper surface of the dielectric capping layer 14. See FIG. 2A. In the embodiment in which the dielectric capping layer is patterned, a portion of the spacer material is formed on an exposed upper surface of the metal layer 12. See FIG. 2B. In both embodiments, a portion of the spacer material within the via opening 18 and line opening 20 is located on exposed surfaces of the patterned dielectric material 16.

The spacer material 24 that is employed in the present disclosure includes any insulating material or combination of insulating materials. In one embodiment, the spacer material 24 is an oxide such as, for example, silicon oxide. In another embodiment, the spacer material 24 is a nitride, such as, for example, silicon nitride. In yet another embodiment of the present disclosure, the spacer material 24 is a carbide such as, for example, silicon carbide. In addition to the above embodiments, the spacer material 24 can also include an oxynitride, such as silicon oxynitride. Multilayered spacer materials can also be employed.

The spacer material 24 is formed utilizing a conventional deposition process including, for example, chemical vapor deposition (CVD), plasma enhanced chemical vapor deposition (PECVD), atomic layer deposition (ALD), physical vapor deposition (PVD), sputtering and chemical solution deposition. The thickness of the spacer material 24 that is formed may vary depending on the type of spacer material employed, the number of spacer materials employed and the technique that is used in forming the same. Typically, the spacer material 24 that is formed has a thickness from 2 nm to 400 nm, with a thickness from 15 nm to 80 nm being more typical.

Figure 2A:
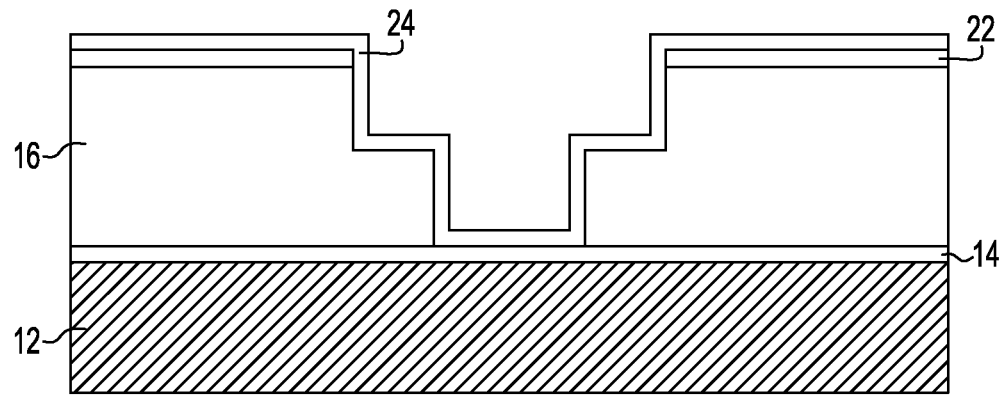
FIG. 2A is a pictorial representation (through a cross sectional view) depicting the initial structure of FIG. 1A after forming a spacer material atop the patterned hard mask and within the via opening and line opening.
Figure 2B:
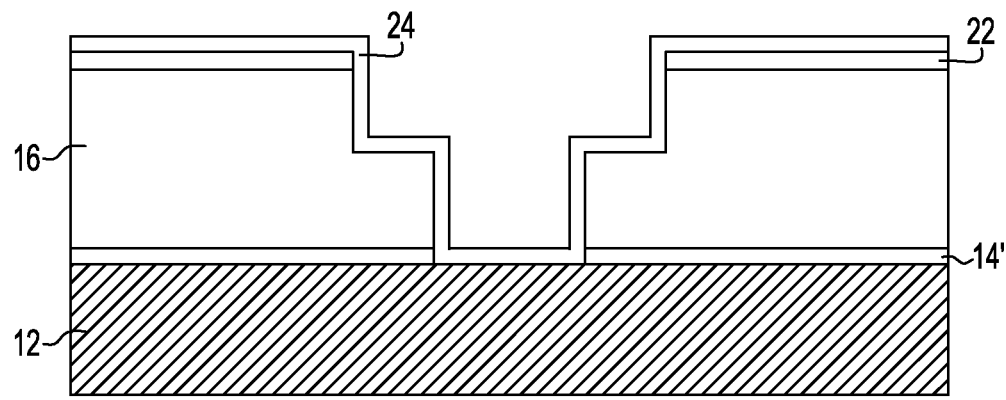
FIG. 2B is a pictorial representation (through a cross sectional view) depicting the initial structure of FIG. 1B after forming a spacer material atop the patterned hard mask and within the via opening and line opening.
Figure 3A:
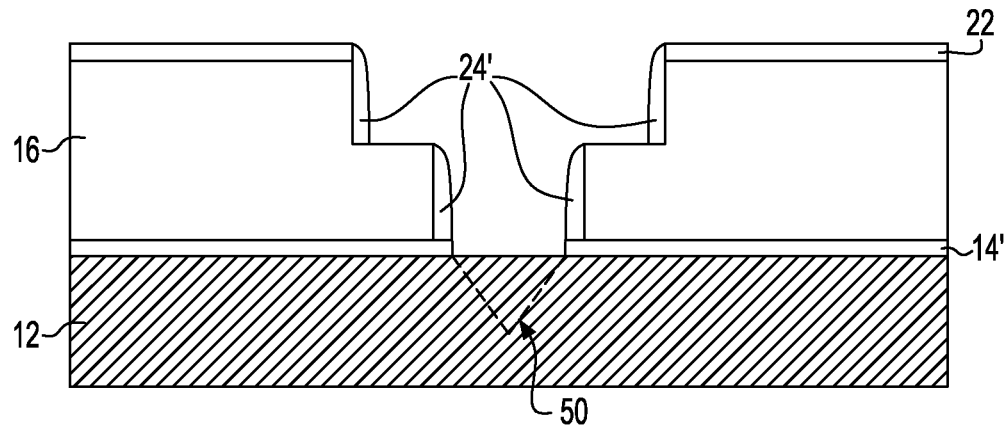
FIG. 3A is a pictorial representation (through a cross sectional view) depicting the structure of FIG. 2A after performing a directional etching process in which dielectric spacers are formed on the sidewalls of the patterned dielectric material within the via opening and the line opening.
Figure 3B:
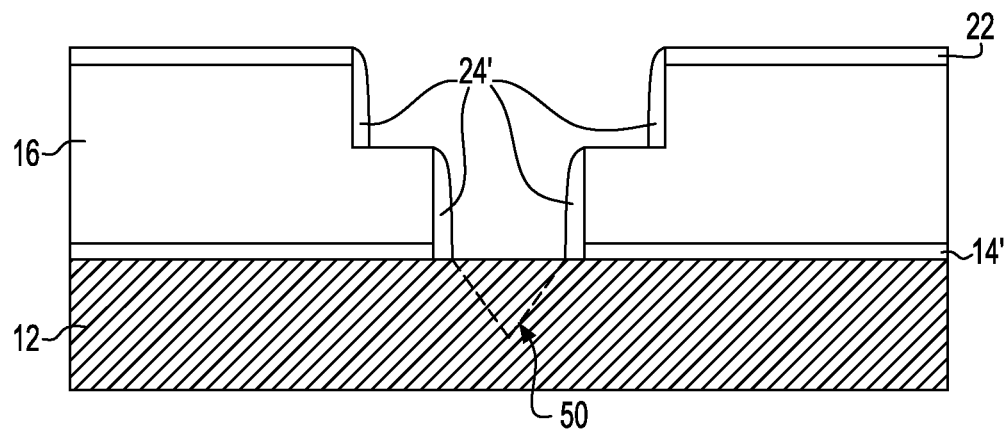
FIG. 3B is a pictorial representation (through a cross sectional view) depicting the structure of FIG. 2B after performing a directional etching process in which dielectric spacers are formed on the sidewalls of the patterned dielectric material within the via opening and the line opening.

Referring now to FIGS. 3A and 3B, there are shown the structures of FIGS. 2A and 2B, respectively, after converting the spacer material 24 within the line opening 20 and the via opening 18 into dielectric spacers 24'. The dielectric spacers 24' within the line opening 20 and the via opening 18 decrease the area of the original line opening, i.e., line opening 20, and the original via opening, i.e., via opening 18. The dielectric spacers 24' are formed by performing a directional etching step, e.g., an ionized gaseous sputtering process. In one embodiment, the directional etching step includes an ionized Ar sputtering/etching process. In such an embodiment, ionized Ar sputtering can be performed utilizing the following non-limiting conditions: gas flow of 20 sccm Ar, temperature of 25° C., bias of top electrode of 400 KHz and 750 W, table bias of 13.6 MHz and 400 W, and a process pressure of 0.6 mtorr. While Ar is a good sputtering resource, any other gas such as, for example, He, Ne, Xe, $N_2$, $H_2$, $NH_3$, $N_2H_2$, or mixtures thereof, can also be used for the ionized gaseous sputtering/etching process.

As is illustrated, the spacer material 24 is removed from the horizontal surface of the patterned hard mask 22, as well as substantially from the bottom wall surfaces of both the line opening 20 and the via opening 18. Each dielectric spacer 24' has a sidewall that is in direct physical contact with an exposed vertical sidewall of the patterned dielectric material 16 within the via opening 18 and the line opening 20. In the embodiment, illustrated in FIG. 3A, the directional etching step used in forming dielectric spacers 24' within the via opening 18 also removes an underlying portion of the dielectric capping layer 14 providing patterned dielectric cap layer 14'. As is illustrated in FIG. 3A, the base of the dielectric spacers 24' within the via opening 18 is located atop an unetched portion of the dielectric capping layer. In the embodiment illustrated in FIG. 3B, the base of the dielectric spacers 24' within the via opening 18 is located atop a portion of metal layer 12.

The width of each dielectric spacer 24', as measured at its base, is typically from 2 nm to 400 nm, with a width from 15 nm to 80 nm being more typical.

In some embodiments of the present disclosure (no specifically shown), a via gouging feature is formed into the metal layer 12. In FIGS. 3A and 3B, the via gouging feature within the metal layer 12 is represented by area 50 that is included within the phantom dashed lines; if present the gouging via feature represented by area 50 would be devoid of any material at this point of the present disclosure. The via gouging feature can be formed utilizing one of the ionized gaseous sputtering processes mentioned above in forming the dielectric spacers 24'. In some embodiments, the via gouging feature can be formed as a result of extending the ionized gaseous sputtering process used in creating the dielectric spacer 24'. In other embodiments, the via gouging feature can be formed in a separate step from forming the dielectric spacer 24'.

In some embodiments (also not shown), a metallic interfacial layer can be selectively formed on the exposed upper surface of the remaining metal layer 12 within the via gouging feature. The metallic interfacial layer is formed utilizing any conventional deposition process including, for example, chemical vapor deposition (CVD), plasma enhanced chemical vapor deposition (PECVD), chemical solution deposition, evaporation, metalorgano deposition, atomic layer deposition (ALD), or plating (electroless or electro). The thickness of the metallic interfacial layer may vary depending on the exact metallic interfacial material used as well as the deposition technique that was used in forming the same. Typically, the metallic interfacial layer has a thickness from 0.5 nm to 40 nm, with a thickness from 1 nm to 10 nm being even more typical. The metallic interfacial layer includes a metallic barrier material such as, for example, Co, TaN, Ta, Ti, TiN, Ru, Mn, Ir, Au, Rh, Pt, Pd or Ag. Alloys of such materials are also contemplated.

Figure 4A:
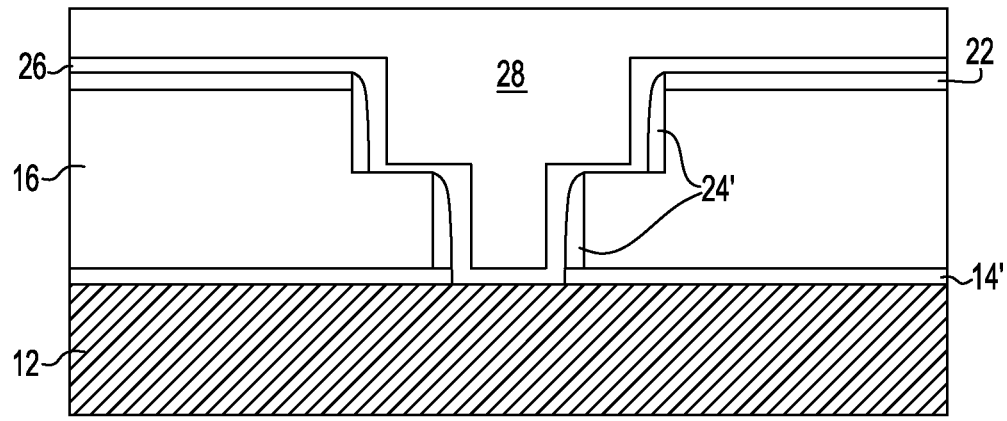
FIG. 4A is a pictorial representation (through a cross sectional view) depicting the structure of FIG. 3A after forming a layer of a diffusion barrier material and a layer of a conductive material at least within the via opening and the line opening.
Figure 4B:
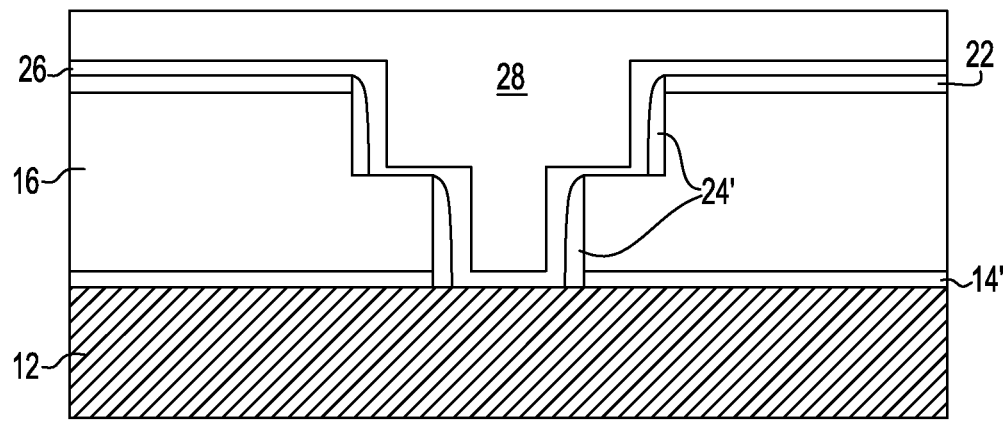
FIG. 4B is a pictorial representation (through a cross sectional view) depicting the structure of FIG. 3B after forming a layer of a diffusion barrier material and a layer of a conductive material at least within the via opening and the line opening.

Reference is now made to FIGS. 4A and 4B which represent the structures of FIGS. 3A and 3B, respectively, after forming a layer of a diffusion barrier material 26 and a layer of conductive material 28.

The layer of diffusion barrier material 26 is formed on all exposed surfaces (horizontal and vertical) of the structures shown in FIGS. 3A and 3B. The layer of diffusion barrier material 26 can comprise Ta, TaN, Ti, TiN, Ru, RuN, RuTa, RuTaN, W, WN or any other material that can serve as a barrier to prevent a conductive material from diffusing there through. Combinations of these materials can also be employed forming a multilayered stacked diffusion barrier. The layer of diffusion barrier material 26 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the layer of diffusion barrier material 26 may vary depending on the number of material layers within the barrier, the technique used in forming the same as well as the material of the diffusion barrier itself. Typically, the layer of diffusion barrier material 26 has a thickness from 4 nm to 40 nm, with a thickness from 7 nm to 20 nm being even more typical.

In some embodiments, an adhesion/plating seed layer (not specifically shown) is also formed atop the layer of diffusion barrier material 26; in embodiments when the adhesion/plating seed layer is used, reference numeral 26 can also be used to represent a material stack including both the layer of diffusion barrier material and the optional adhesion/plating seed layer. When employed, the optional adhesion/plating seed layer is comprised of a metal or metal alloy from Group VIIIA of the Periodic Table of Elements. Examples of suitable Group VIIIA elements for the adhesion/plating seed layer include, but are not limited to, Ru, TaRu, Jr, Co, Rh, Pt, Pd and alloys thereof. In some embodiments, it is preferred to use Ru, Jr or Rh as the optional adhesion/plating seed layer. The optional adhesion/plating seed layer is formed by a conventional deposition process including, for example, chemical vapor deposition (CVD), plasma enhanced chemical vapor deposition (PECVD), atomic layer deposition (ALD), plating, sputtering and physical vapor deposition (PVD). The thickness of the optional adhesion/plating seed layer may vary depending on number of factors including, for example, the compositional material of the adhesion/plating seed layer and the technique that was used in forming the same. Typically, the optional adhesion/plating seed layer has a thickness from 0.5 nm to 10 nm, with a thickness of less than 6 nm being even more typical.

The layer of conductive material 28 may comprise the same or different, preferably the same, conductive material as that of metal layer 12. In one embodiment, Cu, Al, W or alloys thereof are used as the layer of conductive material 28, with Cu or AlCu being more typically employed as the layer of conductive material 28. The layer of conductive material 28 can be formed utilizing one of the deposition processes as described above in forming the metal layer 12. The thickness of the layer of conductive material 28 may vary depending on the conductive material employed as well as the technique that was used in forming the same.

Figure 5A:
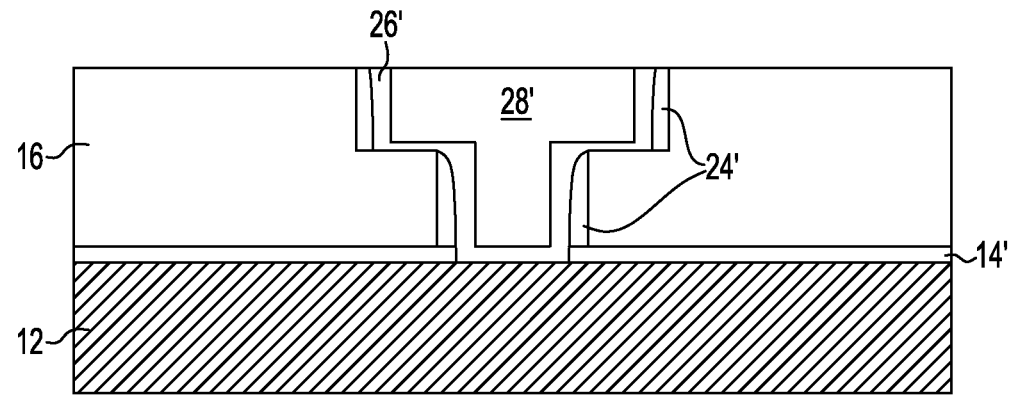
FIG. 5A is a pictorial representation (through a cross sectional view) depicting the structure of FIG. 4A after performing a planarization process.
Figure 5B:
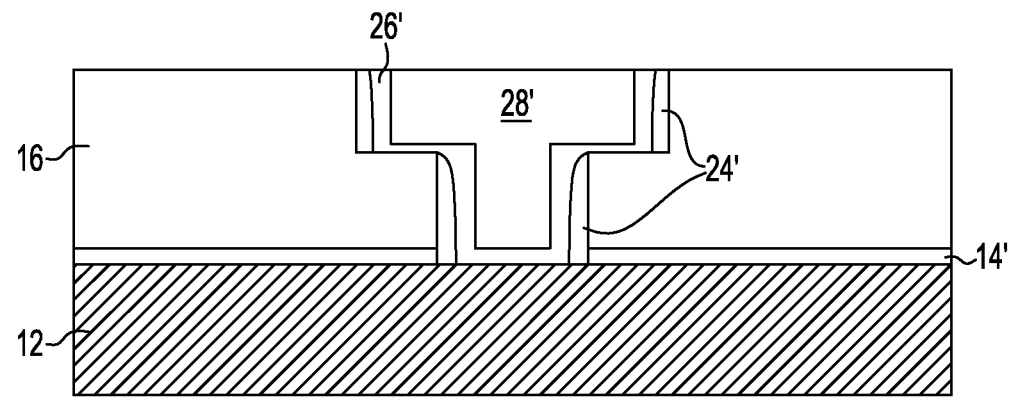
FIG. 5B is a pictorial representation (through a cross sectional view) depicting the structure of FIG. 4B after performing a planarization process.

After providing the structure shown in FIG. 4A or FIG. 4B, the structure is subjected to a conventional planarization process such as, for example, chemical mechanical planarization and/or grinding providing the structure shown in FIG. 5A or FIG. 5B. The planarization process removes various materials, including a portion of the layer of diffusion barrier material 26, a portion of the layer of conductive material 28 and the patterned hard mask 22 that are located atop the patterned dielectric material 16. In FIG. 5A and FIG. 5B, reference numeral 28' denotes a remaining planarized portion of the layer of conductive material 28 and reference numeral 26' denotes a remaining planarized portion of the layer of diffusion material 26. It is noted that the remaining planarized portion of the layer of conductive material 28' (e.g., conductive material 28') and the remaining planarized portion of the layer of diffusion barrier material 26' (e.g., diffusion barrier 26') each have an upper surface that is coplanar with the patterned dielectric material 16. As is also illustrated in the drawings, the dielectric spacers 26' within the line opening 20 also have an upper surface that is coplanar with the upper surface of the patterned dielectric material 16.

FIGS. 5A and 5B represent the electrical fuse structure of the present disclosure. The electrical fuse structure includes metal layer 12 located on a substrate (not shown). A patterned dielectric material 16 including a via opening 18 and a line opening 20 is located atop the metal layer 12. The line opening 20 is located above and connected to the via opening 18 and the via opening 28 is located above and connected to the metal layer 12. In some embodiments, a patterned dielectric capping layer 14' is present between the metal layer 12 and the patterned dielectric material. A conductive feature represented by elements 28' and 26' is present in the via opening 18 and line opening 20. Dielectric spacers 24' are also located within the via opening 18 and the line opening 20 and separate the conductive feature from sidewalls of the patterned dielectric material 16. It is observed that metal layer 12 represents a first metal plate of the electrical fuse, while a portion of the conductive material 28' that is within the line opening 20 denotes a second metal plate of the electrical fuse structure. The portion of the conductive material 28' that is within the via opening 18 represents the fuselink of the electrical fuse of the present disclosure.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   an electrical fuse located perpendicular to a surface of a semiconductor chip and comprising:
   a patterned dielectric material of unitary construction and comprising a single dielectric material composition and including a via opening and a line opening located atop a metal layer, wherein the line opening is located above and connected to the via opening and the via opening is located above and connected to the metal layer, wherein said metal layer is a continuous material layer that extends beneath the entirety of the patterned dielectric material;
   a conductive feature including at least a diffusion barrier and a conductive material present in the via opening and line opening, wherein said diffusion barrier is continuously present in said via opening and said line opening; and
   dielectric spacers selected from the group consisting of silicon oxide, silicon nitride, silicon carbide and silicon oxynitride located directly on sidewalls of the patterned dielectric material within the via opening and the line opening and separating the conductive feature from said sidewalls of the patterned dielectric material, wherein topmost surfaces of said diffusion barrier, said conductive material and each of said dielectric spacers in said line opening are coplanar with a topmost surface of said patterned dielectric material.

2. The semiconductor structure of claim 1 further comprising a patterned dielectric capping layer present between the metal layer and the patterned dielectric material.

3. The semiconductor structure of claim 1 wherein said patterned dielectric material has a dielectric constant of 4.0 or less.

4. The semiconductor structure of claim 1 further comprising a via gouging feature present in said metal layer.

5. The semiconductor structure of claim 1 wherein an upper surface of the conductive feature is coplanar with an upper surface of the patterned dielectric material, and wherein the dielectric spacers within the line opening also have an upper surface that is coplanar with the upper surface of the patterned dielectric material.

6. The semiconductor structure of claim 1 wherein said metal layer comprises Cu, W, Al or an alloy thereof.

7. The semiconductor structure of claim 1 wherein said diffusion barrier is selected from Ta, TaN, Ti, TiN, Ru, RuN, RuTa, RuTaN, W and WN.

8. The semiconductor structure of claim 1 wherein portions of said diffusion barrier are separated from wall portions of the patterned dielectric material within said via opening and said line opening by said dielectric spacers.

9. The semiconductor structure of claim 1 wherein said conductive material comprises Cu or a Cu alloy.

10. The semiconductor structure of claim 1 wherein said metal layer comprises a first metal plate, said conductive material within said via opening represents a fuselink, and said conductive material within said line opening represents a second metal plate of said electrical fuse structure.

11. The semiconductor structure of claim 2 wherein a base of each dielectric spacer within the via opening is located directly on an exposed surface of the patterned dielectric capping layer.

12. The semiconductor structure of claim 2 wherein a base of each dielectric spacer within the via opening is located directly on an exposed surface of the metal layer.

13. The semiconductor structure of claim 2 wherein said dielectric capping layer comprises SiC, $Si_4NH_3$, $SiO_2$, a carbon doped oxide, a nitrogen and hydrogen doped silicon carbide SiC(N,H) or multilayers thereof.

* * * * *